United States Patent
Doerr

(10) Patent No.: US 11,848,535 B1
(45) Date of Patent: Dec. 19, 2023

(54) INTEGRATION OF OPTICAL GAIN SUBASSEMBLY WITH SILICON PHOTONICS

(71) Applicant: Acacia Communications, Inc., Maynard, MA (US)

(72) Inventor: Christopher Doerr, Middletown, NJ (US)

(73) Assignee: Acacia Communications, Inc., Maynard, MA (US)

( * ) Notice: Subject to any disclaimer, the term of this patent is extended or adjusted under 35 U.S.C. 154(b) by 39 days.

(21) Appl. No.: 17/185,472

(22) Filed: Feb. 25, 2021

(51) Int. Cl.
*H01S 5/026* (2006.01)
*H01S 5/14* (2006.01)
*H01S 5/50* (2006.01)

(52) U.S. Cl.
CPC .......... *H01S 5/0262* (2013.01); *H01S 5/0265* (2013.01); *H01S 5/146* (2013.01); *H01S 5/50* (2013.01)

(58) Field of Classification Search
CPC .............................. H01S 5/0262; H01S 5/0265
See application file for complete search history.

(56) References Cited

U.S. PATENT DOCUMENTS

| | | | | |
|---|---|---|---|---|
| 8,879,873 B2 * | 11/2014 | Goh | ................... | H04B 10/5053 385/3 |
| 9,464,883 B2 * | 10/2016 | Swanson | ............ | G01B 9/02091 |
| 2008/0044128 A1 * | 2/2008 | Kish, Jr. | ............ | G02B 6/12033 385/14 |
| 2016/0041336 A1 * | 2/2016 | Doerr | ................... | G02B 6/2726 398/135 |
| 2019/0348814 A1 * | 11/2019 | Baehr-Jones | ......... | G02F 1/2257 |

* cited by examiner

*Primary Examiner* — Tuan N Nguyen
(74) *Attorney, Agent, or Firm* — K&L GATES LLP

(57) ABSTRACT

A system including an optical transceiver, including a first portion of a laser cavity operable to output optical energy; and an optical modulator operable to modulate the optical energy output by the laser; and a temperature-controlled optical gain subassembly optically coupled to the optical transceiver, the optical gain subassembly including a plurality of semiconductor optical amplifiers (SOAs), wherein one SOA of the plurality of SOAs is operable to amplify the optical energy inside a laser cavity.

17 Claims, 4 Drawing Sheets

US 11,848,535 B1

INTEGRATION OF OPTICAL GAIN SUBASSEMBLY WITH SILICON PHOTONICS

FIELD

This disclosure relates generally to the field of photonic circuits such as photonic integrated circuits (PICs).

BACKGROUND

Contemporary optical communications and other photonic systems make extensive use of photonic integrated circuits (PICs) that are advantageously mass-produced in various configurations for various purposes.

SUMMARY

In part, in one aspect, the disclosure relates to a system comprising an optical transceiver, including a first portion of a laser cavity operable to output optical energy; and an optical modulator operable to modulate the optical energy output by the laser; and a temperature-controlled optical gain subassembly optically coupled to the optical transceiver, the optical gain subassembly comprising a plurality of semiconductor optical amplifiers (SOAs), wherein one SOA of the plurality of SOAs is operable to amplify the optical energy inside a laser cavity.

In one embodiment, the system further comprises where the optical gain subassembly further comprises a second SOA, wherein the second SOA is operable to amplify a modulated signal. In one embodiment, the system further comprises where the optical gain subassembly further includes: a second SOA and a third SOA, wherein the second SOA and the third SOA are operable to amplify the first polarization signal; and a fourth SOA and a fifth SOA, wherein the forth SOA and the fifth SOA are operable to amplify the second polarization signal. In one embodiment, the system further includes where the optical gain subassembly further comprises a polarization beam splitter and a waveplate operable to combine the first polarization signal and the second polarization signal into an output optical signal; and an optical fiber connector operable to output the output optical signal. In one embodiment, the system further includes where at least one of the SOAs comprises a u-shaped optical path geometry. In one embodiment, the system further includes an SOA array comprising the plurality of SOAs, wherein a portion of the SOA array is covered with a high-reflective coating. In one embodiment, the system further includes a second portion of the laser cavity within the temperature-controlled optical gain subassembly, wherein the second portion comprising a waveguide coupled to the first SOA. In one embodiment, the system further includes where the temperature-controlled optical gain subassembly is optically coupled to the optical transceiver through a dual lens optical connection. In one embodiment, the system further includes where the dual lens optical connection reduces sensitivity to spatial movement between the temperature-controlled optical gain subassembly and the optical transceiver.

In part, in one aspect, the disclosure relates to a method of sending an optical signal, the method comprising generating the optical signal at an optical transceiver, wherein the optical transceiver includes a first portion of a laser cavity operable to output optical energy; and an optical modulator operable to modulate the optical energy output by the laser; and a temperature-controlled optical gain subassembly optically coupled to the optical transceiver, the optical gain subassembly comprising: a plurality of semiconductor optical amplifiers (SOAs), wherein one SOA of the plurality of SOAs is operable to amplify the optical energy inside a laser cavity; and outputting the optical signal via an optical fiber.

In one embodiment, the method further comprises where the optical gain subassembly further comprises a second SOA, wherein the second SOA is operable to amplify a modulated signal. In one embodiment, the method further comprises where the optical gain subassembly further comprises: a second SOA and a third SOA, wherein the second SOA and the third SOA are operable to amplify the first polarization signal; and a fourth SOA and a fifth SOA, wherein the forth SOA and the fifth SOA are operable to amplify the second polarization signal. In one embodiment, the method further comprises where the optical gain subassembly further comprises: a polarization beam splitter and a waveplate operable to combine the first polarization signal and the second polarization signal into an output optical signal; and an optical fiber connector operable to output the output optical signal. In one embodiment, the method further comprises where at least one of the SOAs comprises a u-shaped optical path geometry. In one embodiment, the method further comprises where the temperature-controlled optical gain subassembly further comprises: a SOA array comprising the plurality of SOAs, wherein a portion of the SOA array is covered with a high-reflective coating. In one embodiment, the method further comprises where the temperature-controlled optical gain subassembly is optically coupled to the optical transceiver through a dual lens optical connection. In one embodiment, the method further comprises where the dual lens optical connection reduces sensitivity to spatial movement between the temperature-controlled optical gain subassembly and the optical transceiver.

In part, in one aspect, the disclosure relates to a system, comprising an uncooled silicon photonic integrated circuit (PIC) comprising a first portion of a laser cavity; and an optical subassembly attachable to the uncooled silicon PIC comprising a second portion of a laser cavity, wherein the optical subassembly is operable to provide cooled optical gain for the laser and signal amplification.

In one embodiment, the system further comprises where a laser operable to output via the first portion and the second portion of the laser cavity is a tunable laser. In one embodiment, the system further comprises where a laser operable to output via the first portion and the second portion of the laser cavity is a fixed wavelength laser.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, optical paths, waveguides, splitters, couplers, combiners, electro-optical devices, inputs, outputs, ports, channels, components and parts of the foregoing disclosed herein can be used with any laser, laser-based communication system, waveguide, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

Figure 1:
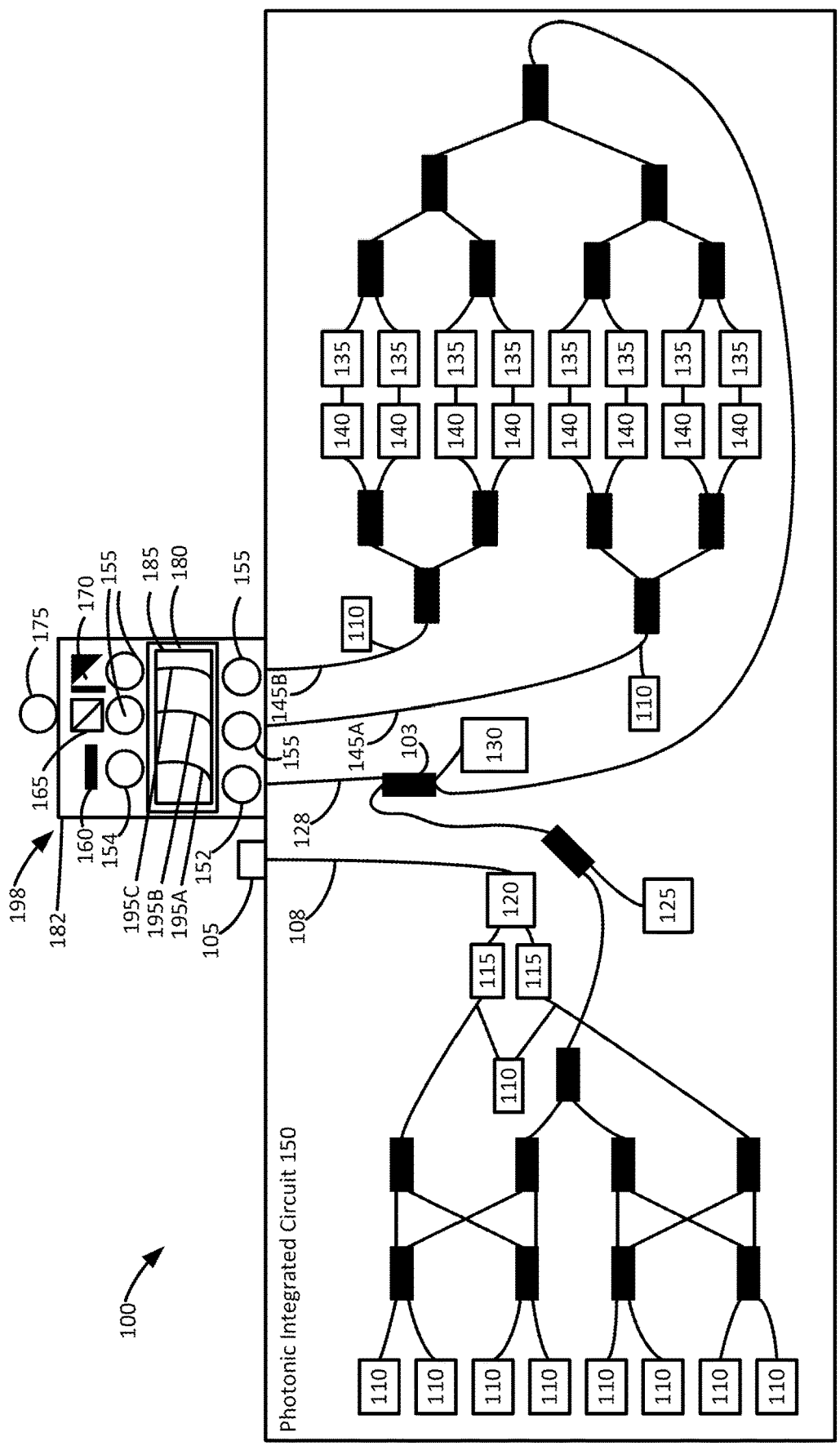
FIG. 1 is a high level component diagram of a first configuration of a silicon photonic integrated circuit coupled to an optical gain subassembly, in accordance to one or more embodiments of the disclosure.

In part, the disclosure relates to an implementation of an optical gain subassembly operable to be directly integrated with a silicon photonic integrated circuit (PIC). Generally, an advantage of silicon photonics is it can be integrated and/or co-packaged with high-speed electronics, resulting in optical transceivers with a small footprint, high signal integrity, and low power consumption. However, typically, due to a high amount of power dissipation of electronics, integrating temperature-sensitive semi-conductor lasers and optical gain devices into the silicon photonics is impractical. Typically, available solutions (e.g., erbium doped waveguides) are not mature enough and/or do not provide optimal performance for most applications. Thus, generally, a laser is placed far from the silicon photonics and coupled to it with a fiber, which is expensive, adds insertion loss, and packaging complexity. Alternatively, conventionally, the laser can be separately packaged from the electronics in a large hermetic box, which is expensive and degrades signal integrity.

In various embodiments, a coherent transceiver photonic integrated circuit (PIC) may be directly coupled to an optical gain subassembly containing an array of temperature-controlled semiconductor optical gain elements. In certain embodiments, each subassembly may also include a housing with one or more openings defined thereby to allow the transmission of optical energy. In most embodiments, a PIC may be thermally isolated from an optical gain subassembly, thereby mitigating power consumption required to temperature control the optical gain subassembly. In various embodiments, thermal isolation may be achieved using one or more lenses or other couplers that direct light through free-space such that thermal transfers are limited by a lack of physical contact. In many embodiments, an optical gain subassembly may include a plurality of semiconductor optical amplifiers (SOA) and a plurality of lenses. In various embodiments, an optical gain subassembly may be optically connected to a PIC. In most embodiments, a PIC may allocate a first SOA to amplify optical energy from a laser integrated within the PIC, where optical energy is returned to an input of a laser through the first SOA using a mirror.

In some embodiments, one or more SOAs may be implemented to amplify optical energy from a laser integrated within the PIC.

In various embodiments, amplified optical energy may be split between a transmitter portion and/or a receiver portion of a PIC. In most embodiments, SOAs from an optical gain subassembly may be connected to outputs from a transmitter portion of a PIC. In various embodiments, a transmitted signal may be separated into polarizations of a signal, where each polarization contains data. In most embodiments, each polarization of a signal may be transmitted to an optical gain subassembly through an optical connection through a SOA array. In some embodiments, an optical gain subassembly may include a polarization beam splitter and a waveplate operable to combine each polarization signal received at the optical gain subassembly into a single output signal.

In certain embodiments, an optical gain subassembly may only include an SOA array and associated electronic connections, a thermo-electric cooler, and a plurality of lenses within a hermetically sealed package. In some embodiments, a SOA array may have a high-reflective coating on one facet of the SOA array and an anti-reflective coating on another facet of the SOA array. In some embodiments, optical signals received by an optical gain subassembly may pass through at least one lens and at least one SOA. In certain embodiments, a signal sent through a SOA within a SOA array may be reflected back through the SOA by a high reflective coating on one facet of the SOA array. In some embodiments, a SOA may form a path from a first input to a first output (e.g., in a shape of a u-turn or U-shaped).

In some embodiments, an optical connection between a PIC and an optical gain subassembly may use one lens. In certain embodiments, a single-lens design may be sensitive to translational movement between the SOA and the Si PIC. In various embodiments, two lenses may be used instead of one lens per optical connection. In certain embodiments, two lenses may result in less sensitivity to translational movement between an optical gain subassembly and a silicon PIC, which may be affected by temperature differences between the subassembly and the PIC. In some embodiments, tunable filters (TF) may be added onto the PIC to filter out spontaneous emission after an optical amplification at wavelengths other than a signal.

In many embodiments, an optical gain subassembly may be oriented in various configurations. In some embodiments, an optical gain subassembly may be oriented so that SOAs are parallel to the PIC. In other embodiments, an optical gain subassembly may be oriented standing up using turning mirrors. In yet other embodiments, an optical gain subassembly may be mounted on top of the PIC and use a sequence of turning mirrors to couple the optical gain subassembly to the PIC facet. In various embodiments, different configurations may include multiple tunable lasers and/or more optical gain elements.

Refer to the example embodiment of FIG. 1, which shows a first configuration of a silicon photonic integrated circuit coupled to an optical gain subassembly, in accordance to one or more embodiments of the disclosure. As shown, a PIC 150 is coupled to an optical gain subassembly 198 that may include a housing 182 that includes various components disposed therein. In various embodiments, an optical gain subassembly (e.g., optical gain subassembly 198) may be about 2 mm×4 mm in size. The PIC 150 includes components operable to function as an optical transceiver. The subassembly 198 includes lenses (152, 154, and 155), a semiconductor optical amplifier (SOA) array 185, a thermo-electric cooler 180, a mirror 160, a polarization beam splitter 165, a waveplate 170, and optical couplers (e.g. optical coupler 103). Each of the previously mentioned components may be disposed within a housing 182 with various openings such as for light to enter and/or exit via the lenses 152, 154, and 155. In addition, various components of the subassembly may be in optical communication by a plurality of optical paths between each optical component. As shown, optical couplers split and combine optical signals. In various embodiments, an optical gain subassembly may be components integrated into a circuit (e.g., a PIC) coupled to a thermo-electric cooler. In many embodiments, the optical gain subassembly may be hermetically sealed and/or in a hermetically sealed environment. In various embodiments, a PIC and optical gain subassembly may be attached to a substrate made of a stiff material (e.g., Copper Tungsten (CuW)).

As shown in FIG. 1, the SOA array 185 is coupled to the TEC 180 to manage the temperature of produced by the SOA array 185. The SOA array 185 includes three SOAs (195A-C, 195 generally). SOA 195A provides the internal gain for a tunable or fixed wavelength laser implemented. In various embodiments, a laser may be an optical oscillator with gain inside. In other embodiments, a laser may be a combination of an SOA with reflectors. Referring to the embodiment of FIG. 1, mirror 160, reflective tunable filter 130, and SOA 195A in combination is a laser. The laser includes a laser cavity which is, in part, contained in the PIC 150 and, in part, contained within SOA 195A. The inside of the laser cavity includes waveguide 128, lenses 152 and 154, and SOA 195A, with the ends of the laser cavity defined by mirror 160 and reflective tunable filter (RTF) 130. As shown, the RTF 130 controls the wavelength of the laser. In various embodiments, the RTF may be comprised of tunable ring resonators and loop reflectors. As shown in FIG. 1, the phase/tuning controls in the PIC 150 have a large phase adjustment range (e.g., using suspended thermo-optic phase shifters in silicon) of typically 0 to $20\pi$ radians to account for the external cavity enclosing the PIC 150 not being temperature controlled.

Some optical power of the laser is split by the optical coupler 103 above RTF 130, a portion going to the receiver as a local oscillator and another portion to the transmitter. A received signal enters input 105 and is polarization split by a polarization beam splitter and rotator 120 and each polarization is sent through a variable optical attenuator (VOA) 115 and then to eight high-speed photodiodes 110. A tap and monitor photodiode 110 are also included for the receiver input. The receiver contains VOAs 115 for optical power control and the PIC 150 does not require temperature control, thus there are no thermoelectric coolers or heaters proximate to the PIC 150.

On the transmitter side, there are four in-phase (I)/quadrature (Q) traveling wave modulators (one I and one Q for each polarization)(each comprised of two modulators 135 and two phase shifters 140) and there are monitor photodiodes 110 for feedback control of the modulators 135. In one embodiment, the modulators are Mach-Zehnder modulators (MZMs). A first polarization and a second polarization of a transmitted signal are outputted through connections 145A and 145B respectively. The SOA 195B and SOA 195C provide gain for the two polarization signals exiting the PIC through connections 145A and 145B. Each of the SOAs, 195B and 195C, amplifies mainly transverse-electric (TE) polarization. Once each signal is amplified by the SOA array 185, the transmitted polarizations are combined using waveplate 170 and polarization beam splitter (PBS) 165 before being transmitted out at output 175, which is coupled to a fiber. In various embodiments, a collimator fiber assembly may be used to output a transmitted signal. In most embodiments, a collimator may be a device which creates a light beam that may be propogated over some distance (e.g., a few millimeters). Refer back to the example embodiment of FIG. 1, there are two fiber connections to the assembly 100. As shown in FIG. 1, the optical gain subassembly 198 is hermetically sealed, due to the TEC 180 contained within, while the PIC 150 and electronics do not require a hermetically sealed environment. In most embodiments, a PIC and electronics may be packaged using lower-cost non-hermetic packaging.

In some embodiments, a PIC may include an integrated wavelength locker (e.g., wavelength locker 125) for maintaining high wavelength accuracy. In various embodiments, an optical gain subassembly may be installed and/or implemented in various configurations and/or orientations. For example, in one embodiment, an optical gain subassembly may be placed upside down so that heat from a hot side of a thermo-electric cooler may pass easily to a top of the module.

Figure 2:
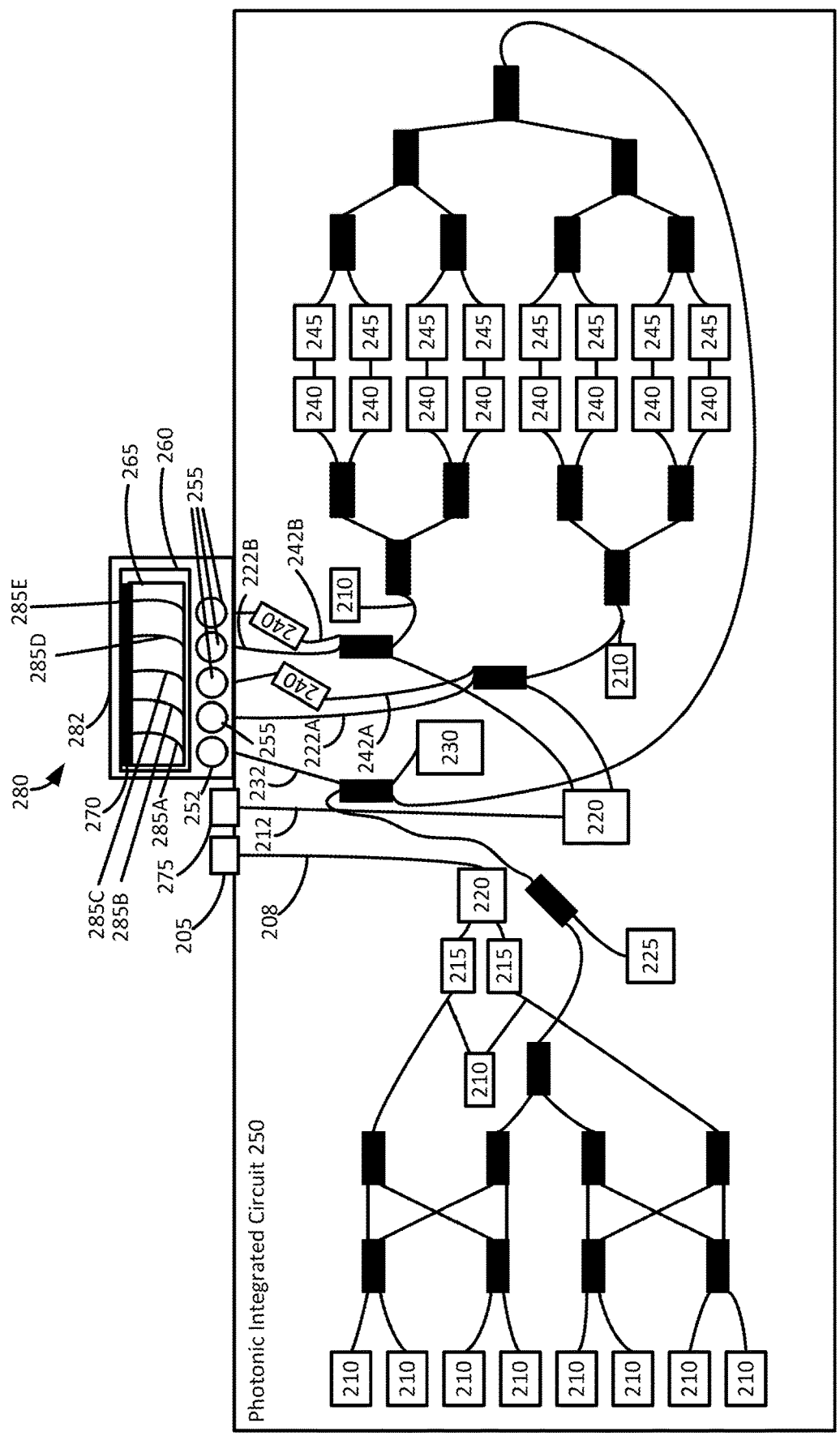
FIG. 2 is a high level component diagram of a second configuration of a silicon PIC coupled to an optical gain subassembly, in accordance with one or more embodiments of the disclosure.

Refer to the example embodiment of FIG. 2, which shows a second configuration of a silicon photonic integrated circuit (PIC) coupled to an optical gain subassembly, in accordance to one or more embodiments of the disclosure. FIG. 2 shows a photonic integrated circuit (PIC) 250 optically coupled to an optical gain subassembly 280. The PIC 250 includes components operable to function as an optical transceiver. The optical gain subassembly 280 includes a SOA array 265 coupled to a thermo-electric cooler 260, and lenses 255, 252 disposed in a housing 282. A portion of the SOA array 265 is coated with a high-reflective (HR) coating 270 on one facet and an anti-reflective (AR) coating on the other facet. The SOA array 265 includes five SOAs (285A-E, 285 generally). SOA 285A provides gain for the tunable or fixed laser and the other four SOAs (285B, 285C, 285D, 285E) are used in two Michelson interferometers to provide the optical gain. In contrast to the configuration shown in FIG. 1, the configuration in FIG. 2 is simplified, as it does not require a polarization beam splitter (PBS), waveplate, or fiber to be attached to the optical gain subassembly. In various embodiments, the reflectivity between a SOA gain chip and a PIC operates optimally with a reflectivity less than about 10-5, otherwise optical gain may exhibit multipath interference (MPI). As shown in the example embodiment of FIG. 2, the gain requirements for the SOA is greater than the example embodiment shown in FIG. 1 because the transmit output goes back into the PIC for polarization combining.

Referring back to the example embodiment of FIG. 2, there is a laser cavity between reflection coating 270 and RTF 230. The coating may be applied to an inner surface of the housing or a component or structure disposed therein. The power of the resulting laser is split, half going to the receiver as a local oscillator and half to the transmitter. A received signal enters input 205 and is polarization split by a polarization beam splitter and rotator 220 and each polarization is sent through a variable optical attenuator (VOA) 215 and then to eight high-speed photodiodes 210. A tap and monitor photodiode 210 is also included for the receiver input. The receiver contains VOAs 215 for optical power control and the PIC 250 does not require any temperature control, thus there are no thermoelectric coolers or heaters proximate to the PIC 250.

On the transmitter side, there are four in-phase (I)/quadrature (Q) traveling wave modulators (MZMs) (each comprised of two modulators 245 and two phase shifters 240)

and there are monitor and tap photodiodes 210 for feedback control of the modulators 245. A first signal and a second signal of a transmitted signal are amplified by the SOAs 285 and then combined as different polarizations in the transmitter output signal. The first polarization is sent through connection 222A and 242A and the second polarization is sent through connection 222B and 242B. SOA 285B, SOA 285C, SOA 285D, and SOA 285E provide gain for the polarization signals, which are reflected by HR coating 270 back into the PIC 250. The reflected signals are combined within the polarization beam splitter and rotator 220 and output via connection 275. As shown in FIG. 2, the optical gain subassembly 280 is hermetically sealed with the TEC 260.

Figure 3:
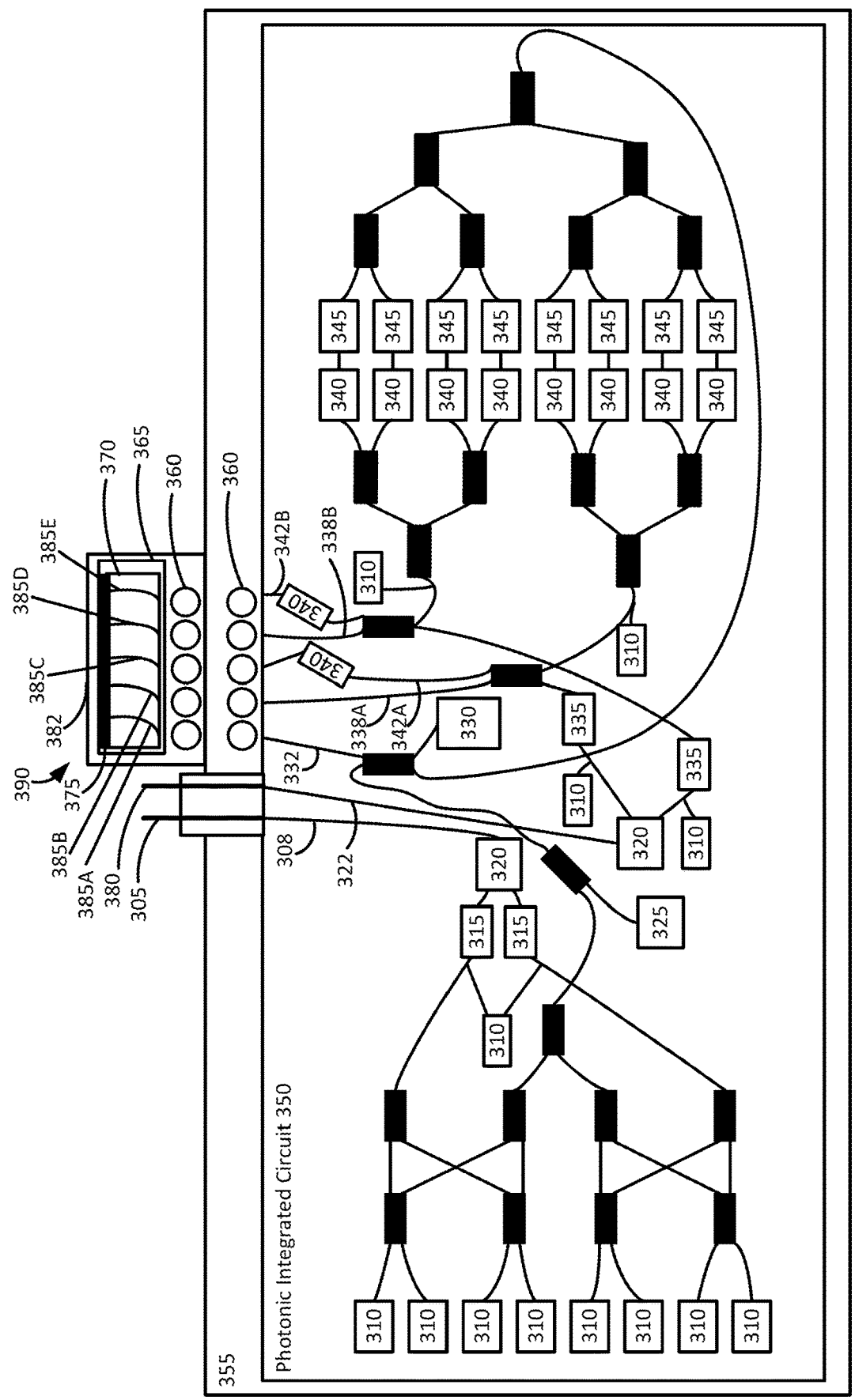
FIG. 3 is a high level component diagram of a third configuration of a silicon PIC coupled to an optical gain subassembly, in accordance with one or more embodiments of the disclosure.

Refer to the example embodiment of FIG. 3, which shows a third configuration of a silicon photonic integrated circuit (PIC) coupled to an optical gain subassembly, in accordance with one or more embodiments of the disclosure. As shown in FIG. 3, PIC 350 is coupled to an optical gain subassembly 390 and a tunable filter 355. The PIC 350 includes components operable to function as an optical transceiver. The subassembly 390 includes lenses 360, a semiconductor optical amplifier (SOA) array 370, and a thermoelectric cooler (TEC) 365 within a housing 382. A portion of the SOA array 370 is coated with a high reflective (HR) coating 375 on one facet and an anti-reflective (AR) coating on the other facet. The coating may be applied to an inner surface of the housing 382 or a component or structure disposed within the housing 382. The SOA array 370 includes five SOAs (385A-E, 385 generally). SOA 385A provides gain for the tunable or fixed laser and the other four SOAs (385B, 385C, 385D, 385E) are used in two Michelson interferometers to provide the optical gain. Similar to the configuration of FIG. 2, FIG. 3 shows a simplified implementation without a polarization beam splitter (PBS), waveplate, or fiber to be attached to the optical gain subassembly. Inputs and outputs, both via fiber, enter through connections 305 and 380 respectively.

The power of the resulting laser is split, where half goes to the receiver as a local oscillator and half to the transmitter. A received signal enters input 305 and is polarization split by a polarization beam splitter and rotator 320 and each polarization is sent through a variable optical attenuator (VOA) 315 and then to eight high-speed photodiodes 310. A tap and monitor photodiode 310 are also included for the receiver input. The receiver contains VOAs 315 for optical power control and the PIC 350 does not require temperature control, thus there are no thermoelectric coolers or heaters proximate to the PIC 350. In various embodiments, a tunable filter may be for removing some of SOA amplified spontaneous emissions.

Referring back to the embodiment of FIG. 3, there is a transmitter side with four in-phase (I)/quadrature (Q) traveling wave modulators (MZMs) (each comprised of two modulators 345 and two phase shifters 340) and there are monitor and tap photodiodes 310 for feedback control of the modulators 345. A first polarization and a second polarization of a transmitted signal are where the first polarization is sent through connection 338A and 342A and the second polarization is sent through connection 338B and 342B. SOA 385B, SOA 385C, SOA 385D, and SOA 385E provide gain for the polarization signals, which are reflected by the HR coating 375 back into PIC 350. The reflected signals are then combined within the polarization beam splitter (PBS) and rotator 320 and output via connection 380. The optical gain subassembly 390 is hermetically sealed within the TEC 365. FIG. 3 shows an implementation using two lenses per optical connection, which results in less sensitivity to translational movement between the optical gain subassembly 390 and the PIC 350. Optical filters 335 attenuate amplified spontaneous emission from the 385B, SOA 385C, SOA 385D, and SOA 385E at wavelengths other than the signal wavelength for the purpose of noise reduction in the signal. In various embodiments, optical filters may be fixed or tunable depending on whether the signal wavelength is fixed or tunable.

Figure 4:
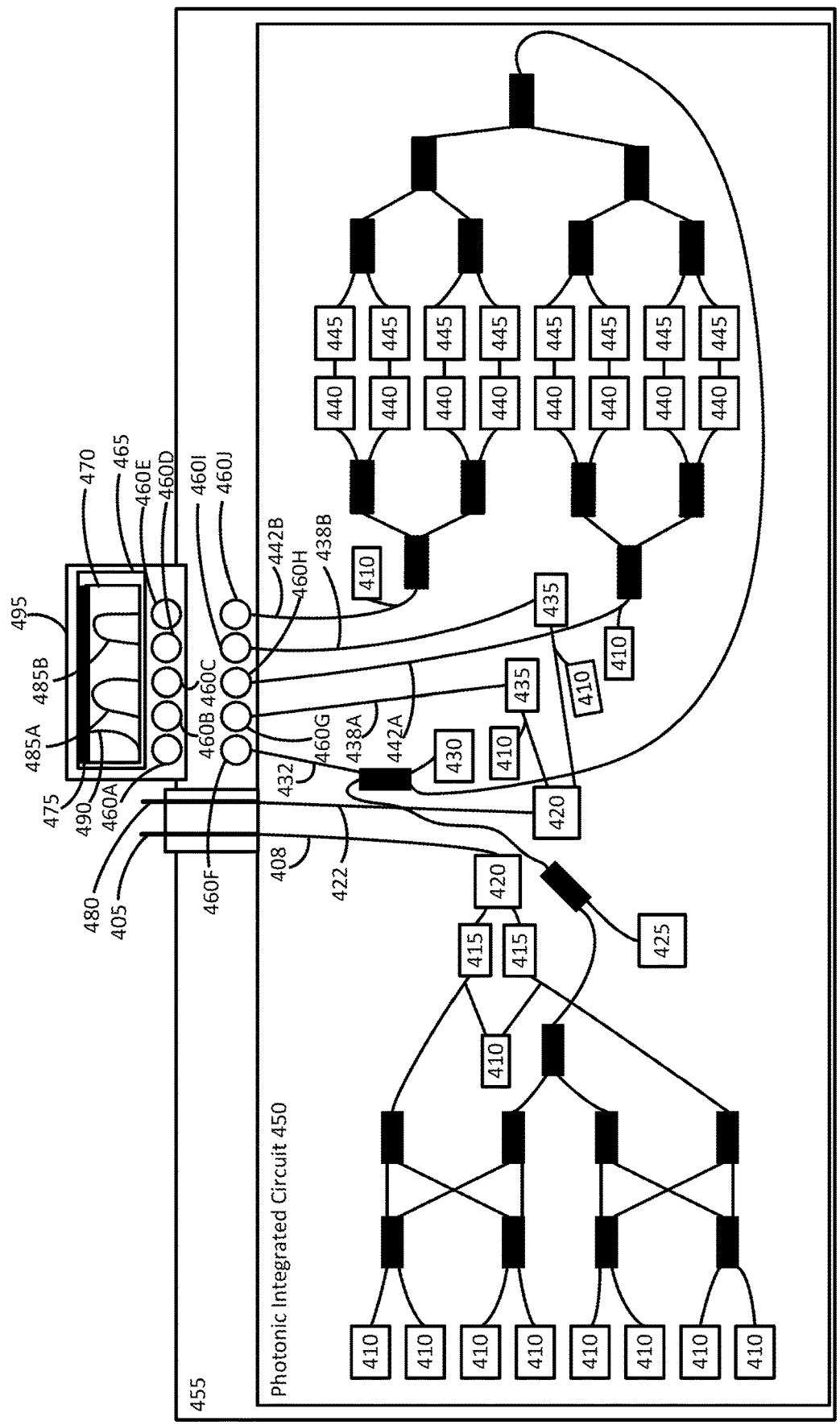
FIG. 4 is a high level component diagram of a fourth configuration of silicon PIC coupled to an optical gain subassembly, in accordance with one or more embodiments of the disclosure.

Referring to the example embodiment of FIG. 4, which shows a fourth configuration of a silicon photonic integrated circuit (PIC) coupled to an optical gain subassembly, in accordance to one or more embodiments of the disclosure. FIG. 4 shows a photonic integrated circuit (PIC) 450 optically coupled to an optical gain subassembly 495. The PIC 450 includes components operable to function as an optical transceiver. As shown, the optical gain subassembly 495 includes a SOA array 470 coupled to a thermoelectric cooler (TEC) 465, and lenses 460. A portion of the SOA array 470 is coated with a high-reflective (HR) coating 475 on one facet and an anti-reflective (AR) coating on the other facet. The SOA array 470 of FIG. 4 includes SOA 490 and SOA 485A and SOA 485B. SOA 485A is routed through the SOA array 470 from a first lens 460C to a second lens 460B using a u-turn or u-shaped optical path geometry. Similarly, SOA 485B is routed through the SOA array 470 from a first lens 460E to a second lens 460D using a u-turn or u-shaped optical path geometry. As shown, SOA 490 provides gain for the tunable laser and the other two SOAs (485A, 485B) provide the optical gain for the transmitter output.

The power of the laser is split, half going to the receiver as a local oscillator and half to the transmitter. A received signal enters input 405 and is polarization split by a polarization beam splitter and rotator 420 and each polarization is sent through a variable optical attenuator (VOA) 415 and then to eight high-speed photodiodes 410. A tap and monitor photodiode 410 is also included for the receiver input. The receiver contains VOAs 415 for optical power control and the PIC 450 does not require any temperature control, thus there are no thermoelectric coolers or heaters proximate to the PIC 450.

On the transmitter side, there are four in-phase (I)/quadrature (Q) traveling wave modulators (MZMs) (each comprised of two modulators 445 and two phase shifters 440) and there are monitor and tap photodiodes 410 for feedback control of the modulators 445. A first polarization and a second polarization of a transmitted signal are sent through connection 442A and 442B respectively, where the amplified signals output the optical gain subassembly 495 at connections 438A and 438B respectively SOAs 485A and 485B provide gain for the polarization signals. The reflected signals are combined within the polarization beam splitter and rotator 420 and output via connection 480. The optical gain subassembly 495 is hermetically sealed with the TEC 465. Optical filters 435 attenuate amplified spontaneous emission from the SOAs 485A and 485B at wavelengths other than the signal wavelength for the purpose of noise reduction in the signal. In various embodiments, optical filters may be fixed or tunable depending on whether the signal wavelength is fixed or tunable.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A system comprising:
   an optical transceiver comprising:
      a first portion of a laser cavity operable to output optical energy; and
      an optical modulator operable to modulate the optical energy output by the first portion of the laser cavity; and
   a temperature-controlled optical gain subassembly optically coupled to the optical transceiver,
   the temperature-controlled optical gain subassembly comprising:
      a plurality of semiconductor optical amplifiers (SOAs), wherein one SOA of the plurality of SOAs is operable to amplify the optical energy inside a laser cavity.

2. The system of claim 1, wherein the temperature-controlled optical gain subassembly further comprises:
   a second SOA, wherein the second SOA is operable to amplify a modulated signal.

3. The system of claim 1, wherein the temperature-controlled optical gain subassembly further comprises:
   a second SOA and a third SOA, wherein the second SOA and the third SOA are operable to amplify the first polarization signal; and
   a fourth SOA and a fifth SOA, wherein the fourth SOA and the fifth SOA are operable to amplify the second polarization signal.

4. The system of claim 1, wherein the temperature-controlled optical gain subassembly further comprises:
   a polarization beam splitter and a waveplate operable to combine the first polarization signal and the second polarization signal into an output optical signal; and
   an optical fiber connector operable to output the output optical signal.

5. The system of claim 1, wherein at least one of the SOAs comprises a u-shaped optical path geometry.

6. The system of claim 1, further comprising:
   an SOA array comprising the plurality of SOAs, wherein a portion of the SOA array is covered with a high-reflective coating.

7. The system of claim 1, further comprising:
   a second portion of the laser cavity within the temperature-controlled optical gain subassembly, wherein the second portion comprising a waveguide coupled to the first SOA.

8. The system of claim 1, wherein the temperature-controlled optical gain subassembly is optically coupled to the optical transceiver through a dual lens optical connection.

9. The system of claim 8, wherein the dual lens optical connection reduces sensitivity to spatial movement between the temperature-controlled optical gain subassembly and the optical transceiver.

10. A method of sending an optical signal, the method comprising:
    generating the optical signal at an optical transceiver, wherein the optical transceiver includes:
       a first portion of a laser cavity operable to output optical energy; and
       an optical modulator operable to modulate the optical energy output by the first portion of the laser cavity; and a temperature-controlled optical gain subassembly optically coupled to the optical transceiver, the temperature-controlled optical gain subassembly comprising:
a plurality of semiconductor optical amplifiers (SOAs), wherein one SOA of the plurality of SOAs is operable to amplify the optical energy inside a laser cavity; and
outputting the optical signal via an optical fiber.

11. The method of claim 10, wherein the temperature-controlled optical gain subassembly further comprises:
a second SOA, wherein the second SOA is operable to amplify a modulated signal.

12. The method of claim 11, wherein at least one of the SOAs comprises a u-shaped optical path geometry.

13. The method of claim 11, wherein the temperature-controlled optical gain subassembly further comprises:
a SOA array comprising the plurality of SOAs, wherein a portion of the SOA array is covered with a high-reflective coating.

14. The method of claim 11, wherein the temperature-controlled optical gain subassembly is optically coupled to the optical transceiver through a dual lens optical connection.

15. The method of claim 14, wherein the dual lens optical connection reduces sensitivity to spatial movement between the temperature-controlled optical gain subassembly and the optical transceiver.

16. The method of claim 10, wherein the temperature-controlled optical gain subassembly further comprises:
a second SOA and a third SOA, wherein the second SOA and the third SOA are operable to amplify the first polarization signal; and
a fourth SOA and a fifth SOA, wherein the forth SOA and the fifth SOA are operable to amplify the second polarization signal.

17. The method of claim 10, wherein the temperature-controlled optical gain subassembly further comprises:
a polarization beam splitter and a waveplate operable to combine the first polarization signal and the second polarization signal into an output optical signal; and
an optical fiber connector operable to output the output optical signal.

* * * * *